United States Patent [19]
Kawauchi

[11] Patent Number: 5,187,387
[45] Date of Patent: Feb. 16, 1993

[54] OVERCURRENT DETECTING APPARATUS

[75] Inventor: Shuhei Kawauchi, Kariya, Japan

[73] Assignee: Kabushiki Kaisha Toyoda Jidoshokki Seisakusho, Kariya, Japan

[21] Appl. No.: 716,828

[22] Filed: Jun. 17, 1991

[30] Foreign Application Priority Data

Jun. 18, 1990 [JP] Japan ............... 2-160291

[51] Int. Cl.$^5$ ............................... H03K 5/153
[52] U.S. Cl. ........................ 307/350; 307/362; 307/491
[58] Field of Search .......... 307/362, 350, 491, 494, 307/310; 340/664, 662

[56] References Cited

U.S. PATENT DOCUMENTS

| | | | |
|---|---|---|---|
| 4,331,888 | 5/1982 | Yamauchi | 307/310 |
| 4,634,902 | 1/1987 | Tanaka et al. | 307/491 |
| 4,922,132 | 5/1990 | Horvitz et al. | 307/362 |
| 5,061,863 | 10/1991 | Mori et al. | 307/300 |
| 5,087,830 | 2/1992 | Cave et al. | 307/491 |

FOREIGN PATENT DOCUMENTS

| | | | |
|---|---|---|---|
| 0152218 | 7/1987 | Japan | 307/491 |
| 2-40964 | 2/1990 | Japan | |
| 2-301151 | 12/1990 | Japan | |

*Primary Examiner*—William L. Sikes
*Assistant Examiner*—Toan Tran
*Attorney, Agent, or Firm*—Brooks Haidt Haffner & Delahunty

[57] ABSTRACT

An apparatus for detecting an overcurrent flowing in a power element comprises a sampling resistor, a detector resistor, a reference resistor, a reference potential generator, and a comparator. The sampling resistor generates a sampling potential according to a current flowing in the power element. The detector resistor generates a reference potential. The reference resistor retains a constant resistance ratio relative to the sampling resistor. The reference potential generator alters the reference potential in accordance with a current flowing across the reference resistor. The comparator compares the sampling potential with the reference potential to thereby detect an overcurrent in the power element.

9 Claims, 2 Drawing Sheets

OVERCURRENT DETECTING APPARATUS

This application claims priority of Japanese Patent Application No. 2-160291 filed on Jun. 18, 1990, which is incorporated herein by reference.

BACKGROUND OF THE INVENTION

1. Field of the Invention

The present invention generally relates to an overcurrent detecting apparatus. More specifically, the present invention pertains to an apparatus for detecting an overcurrent in a power element.

2. Description of the Related Art

An apparatus as shown in FIG. 2 is generally used to detect an overcurrent in a semiconductor device. The semiconductor device is provided with an output circuit 31 and a detecting circuit 32. In the output circuit 31, a current IO is divided into a current I1 and a current I2 in a certain ratio at power transistors 33 and 34.

The detecting circuit 32 is provided to detect an overcurrent in the power transistor 33 of output circuit 31. A comparator 36 is provided in the detecting circuit 32 to monitor a reference potential applied from a junction 40 between a pair of resistors 38 and 39. The comparator 36 compares the reference potential to the voltage of a junction 37 located between the power transistor 33 and a current sampling resistor 35. This judges excessive potentials in the power transistor 33, thereby detecting an overcurrent in the output circuit 31.

The reference potential at the junction 40 in the detecting circuit 32 is, however, relatively high and determined by the relative accuracy of the resistors 38 and 39 which vary in accordance with the characteristics of the semiconductor device. Similarly, in order to provide a reliable signal to the comparator, the resistance of sampling resistor 35 in the output circuit 31 must be very stable. However, in practice, production errors and/or the temperature characteristics in the semiconductor device tend to vary the resistance of the sampling resistor 35. As a result, the potential generated at the junction 37 in the output circuit 31 also varies. Therefore variations in the potentials at junctions 37 and 40 can lead to false detections of overcurrents and/or the failure to detect overcurrents.

SUMMARY OF THE INVENTION

It is therefore an object of the present invention to provide an overcurrent detecting apparatus capable of detecting an overcurrent in a power element with high accuracy, unaffected by production errors or temperature characteristics of the device.

To achieve the above object, an overcurrent detecting apparatus according to the present invention is designed as follows. A sampling resistor is provided to generate a sampling potential according to a current flowing in a power element, and a detector resistor is provided in a reference potential generator to generate a reference potential. Further, a first circuit maintaining a relative ratio includes a first reference resistor for maintaining a relative resistance ratio to a detector resistor, while a second circuit maintaining a relative ratio includes a second reference resistor for maintaining a relative resistance ratio to the sampling resistor. First and second current circuits are designed to maintain a predetermined relationship among the values of currents in a reference potential generator, said first circuit maintaining a relative ratio, and second circuit holding a relative ratio, and maintain the relative ratio of the sampling potential to the reference potential. A comparator is also provided to compare the sampling potential with the reference potential. The overcurrent detecting apparatus detects an overcurrent in the power element based on the result of the comparison.

DETAILED DESCRIPTION OF THE PREFERRED EMBODIMENT

Figure 1:
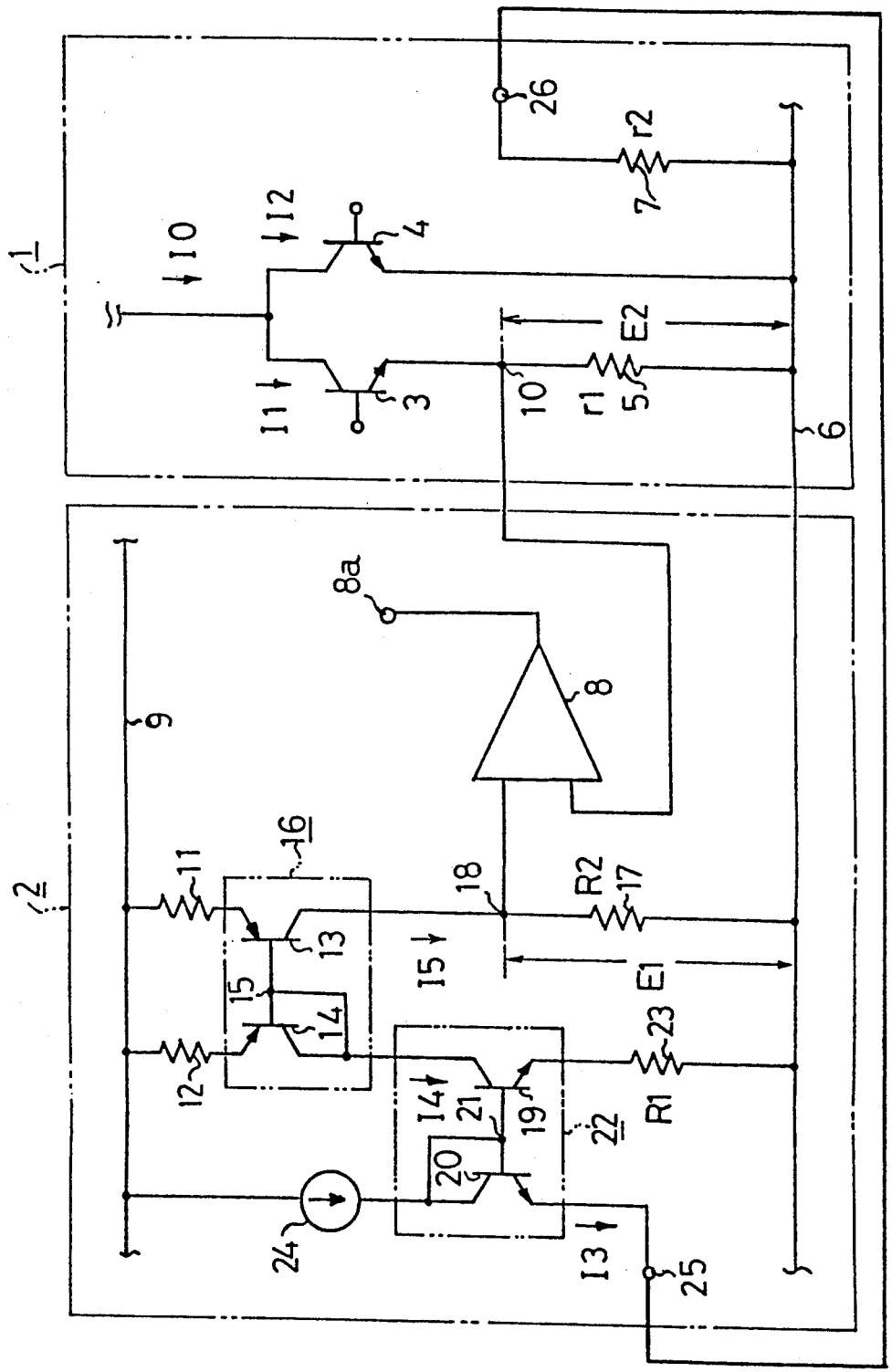
FIG. 1 is a circuit diagram illustrating an overcurrent detecting apparatus according to one embodiment of the present invention.
Figure 2:
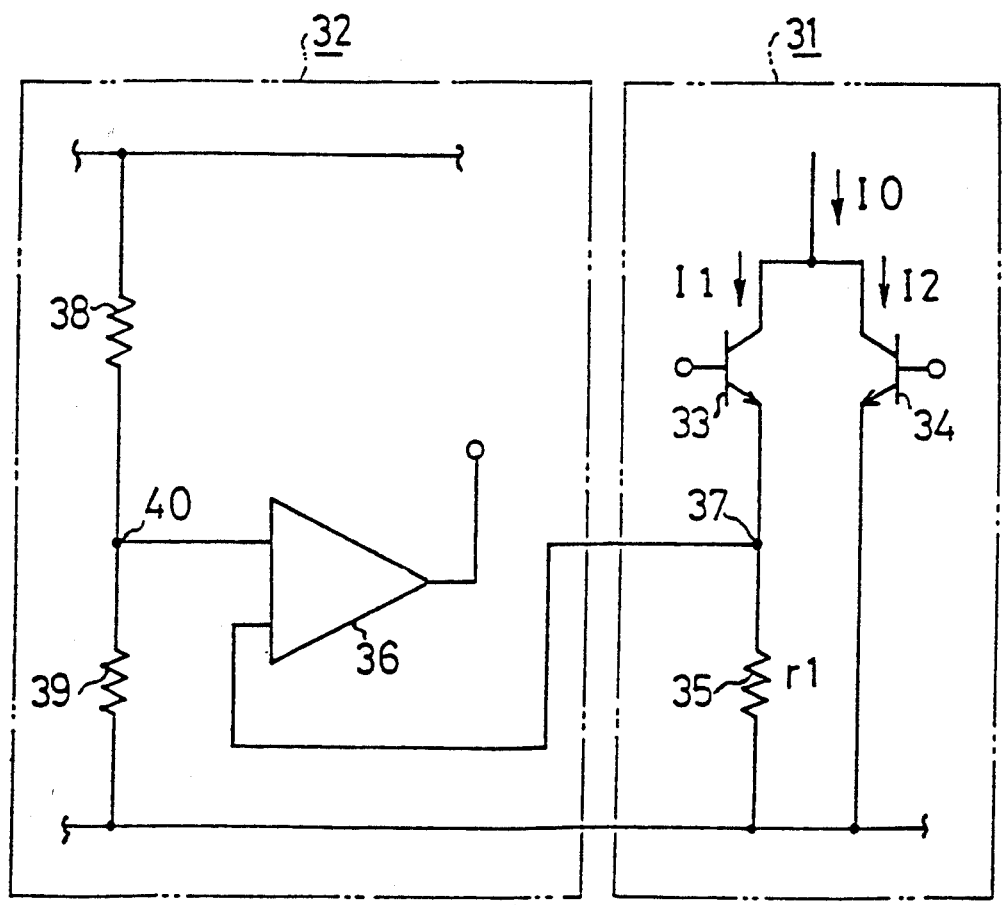
FIG. 2 is a circuit diagram illustrating a conventional overcurrent detecting apparatus.

A preferred embodiment of the present invention as applied to a semiconductor device will now be described referring to the accompanying drawings.

The semiconductor device has an output circuit 1 and a detecting circuit 2 which are formed on a chip. The output circuit 1 is configured into a multi-source multi-gate type by a pair of NPN power transistors 3 and 4 connected to each other through a common connector. The first power transistor 3 is connected to a ground 6 via a sampling resistor 5 (having a resistance of "r1") for sampling the current in the power transistor 3. The second power transistor 4 is connected directly to ground 6. One end of a first reference resistor 7 (having a resistance of "r2") is also connected to the ground 6. The first reference resistor 7 is located in close proximity to the sampling resistor 5. This insures that the temperature and production characteristics of reference the resistor and the sampling resistor will be substantially the same. Thus, the relative ratio of the resistances of the sampling resistor 5 and the reference resistor 7 will remain constant despite the occurrence of production variances and temperature changes. For the purposes of this application, two resistors are said to have a constant relative resistance ratio if the ratio of their actual resistance remains constant despite the occurrence of temperature variations and production errors.

A comparator 8 is provided in the detecting circuit 2. One input terminal of comparator 8 is connected to a junction 10 between the power transistor 3 and the sampling resistor 5.

In the detecting circuit 2, PNP transistors 13 and 14 have their emitters connected to a source 9 via a pair of resistors 11 and 12 (each having a resistance of "R"), respectively, and their bases are connected together. The collector of the transistor 14 is connected to a junction 15 between the bases, thus constituting a first current circuit 16.

In the first current circuit 16, the collector of the transistor 13 is connected to the ground 6 via a detector resistor 17 (having a resistance of "R2"). The detector resistor 17 is designed to generate a reference potential from a predetermined current load flowing in the transistor 13. A junction 18 between the transistor 13 and the detector resistor 17 is connected to a second input terminal of the comparator 8.

The transistor 14 in the first current circuit 16 has its collector connected to the collector of another NPN transistor 19. This transistor 19 has its base connected to the base of an adjoining NPN transistor 20 whose collector is connected to a junction 21 between both bases, thus constituting a second current circuit 22.

The transistor 19 in the second current circuit 22 has its emitter connected to the ground 6 via a second reference resistor 23 (having a resistance of "R1"). The second reference resistor is located in close proximity to the detector resistor 17. Thus it maintains a constant relative resistance ratio with respect to the detector resistor 17. The transistor 20 in the second current circuit 22 has its collector connected to the source 9 via a constant-current circuit 24 while a terminal 25 on the emitter side of the transistor 20 is connected to a terminal 26 from the first reference resistor 7 in the output circuit 1.

According to this embodiment, in the output circuit 1, the sampling resistor 5 and the first reference resistor 7, (both connected to the ground 6), are disposed in close proximity to each other. Similarly, in the detector circuit 2 the detector resistor 17 and the second reference resistor 23, (both connected to the ground 6), are also disposed in close proximity to each other.

In the second current circuit 22, a current I3 flowing in the transistor 20 and a current I4 flowing in the transistor 19 have the relationship expressed by the equation (1) below:

$$I3:I4 = R1:r2 \quad (1)$$

The comparator 8 is designed to operate when a potential E2 generated by the sampling resistor 5 equals the reference potential E1 determined by the detector resistor 17.

A current I0 flowing in the output circuit 1 is divided into a current I1 and a current I2 in a certain ratio at the power transistors 3 and 4 respectively. At this time, the comparator 8 detects the potential E2 generated at the junction 10, which equals "I1×r1". Likewise, when a current I5 flows in the detector resistor 17, the comparator 8 detects the reference potential E1 at the junction 18 in the detector circuit 2, which equals "I5×R2". Then, the comparator 8 compares the potential E2 with the reference potential E1 to determine whether an overcurrent has occurred in the current I1 in the power transistor 3. That is, if the potential E2 is equal to or exceeds the potential E1, the comparator outputs an overcurrent signal. The output of the comparator is connected to an output terminal 8a.

In the first current circuit 16, the current I4 in the transistor 14 equals the current I5 in the transistor 13 because the resistors 12 and 11 have the same resistance of R. Due to this fact and the relationship expressed by the equation (1), the following ratios can be assumed.

$$I3:I4 = I3:I5 = R1:r2$$

Thus, the following equation (2) is established:

$$I5 = (r2/R1) \times I3 \quad (2)$$

When the current I0 flows in the output circuit 1, the reference potential E1 at the junction 18 can be calculated from the equation below:

$$E1 = I5 \times R2$$

Substituting the equation (2) for I5 in the above equation yields:

$$E1 = (r2/R1) \times I3 \times R2$$

Meanwhile, the potential E2 at the junction 10 can be calculated from the equation below:

$$E2 = I1 \times r1$$

Assume now that the resistance r1 of the sampling resistor 5 becomes "α" times its target value due to a production error or temperature characteristics in the semiconductor device. Because the sampling resistor 5 and the first reference resistor 7 are disposed in close proximity to one another, they have a constant relative resistance ratio. Thus, the resistance r2 of the first reference resistor 7 will become "α" times its target value. Likewise, the resistances R1 and R2 of the second reference resistor 23 and the detector resistor 17 respectively will become "β" times their target values because the second reference resistor 23 and the detector resistor 17 are disposed in close proximity to each other.

Then, the reference potential E1 at the junction 18 is as expressed below:

$$\begin{aligned} E1 &= (\alpha \cdot r2/\beta \cdot R1) \times I3 \times \beta \cdot R2 \\ &= \alpha \times (r2/R1) \times I3 \times R2 \end{aligned}$$

Further, the potential E2 at the junction 10 is represented by:

$$\begin{aligned} E2 &= I1 \times \alpha \cdot r1 \\ &= \alpha \times I1 \times r1 \end{aligned}$$

It is apparent from the above two equations that when the potential E2 at the junction 10 increases "α" times, the reference potential E1 at the junction 18 also increases "α" times. This means that the current detecting apparatus in this semiconductor device is free from temperature characteristics, permitting the comparator 8 to operate under preset conditions irrespective of the possible production errors or temperature changes in the semiconductor device. Therefore, such production errors or temperature changes will not affect the accuracy of the resistance r1 of the sampling resistor 5. Accordingly, overcurrents in the output circuit 1 may be accurately detected.

It is to be understood that the present invention is not limited to the above preferred embodiment but that it may be applied to any circuit on a semiconductor chip as long as the circuit serves as a sampling resistor to detect an overcurrent. It is also to be understood that partial modifications and variations may be made to the structure of the present invention without departing from its scope and spirit. Such modifications include:

(1) While the output circuit 1 in the above embodiment is designed to be of a multi-source, multi-gate type comprising a pair of power transistors 3 and 4, it may also be formed in a multi-source type circuit.

(2) The above embodiment was applied to a semiconductor device incorporating the output circuit 1 and the detecting circuit 2 on a chip. However, it may be adapted to a multi-chip device wherein a chip for the output circuit and a chip for the detector circuit are individually provided. For such an embodiment, it is important that the sampling resistor and first reference resistor are provided in close proximity on the output circuit chip, and the detector resistor and second reference resistors in close proximity on the detector circuit chip.

What is claimed is:

1. An overcurrent detecting apparatus comprising:
   a power element;
   a sampling resistor coupled to said power element for providing a sampling potential as a function of the current flowing through said power element when current flows through said power element;
   a current supply circuit having first and second current outputs;
   a detector resistor coupled to said first current output in series;
   a comparator circuit having a first input coupled across said detector resistor and having a second input coupled across said sampling resistor;
   first and second reference resistors having with respect to said sampling and detector resistors, respectively, each a constant relative resistance ratio;
   said second reference resistor being coupled to said second current output in series;
   a source of constant current coupled to said first reference resistor in series; and
   means coupled to said first reference resistor for coupling the voltage drop across said first reference resistor to said second reference resistor for varying the current through said second reference resistor.

2. An overcurrent detecting apparatus according to claim 1, wherein said sampling resistor and said first reference resistor are disposed in close proximity to each other.

3. An overcurrent detecting apparatus according to claim 1, wherein all of said components are embedded in a semiconductor chip.

4. An overcurrent detecting apparatus according to claim 1, wherein said power element, said sampling resistor, and said first reference resistor are formed on a first substrate while said remaining components are formed on a second substrate.

5. An overcurrent detecting apparatus according to claim 1, wherein all of said components are formed on the same substrate.

6. An overcurrent detecting apparatus comprising:
   a power element;
   a sampling resistor connected to said power element for providing a sampling potential as a function of the current flowing through said power element when current flows through said power element;
   a first reference resistor having a resistance the magnitude of which is related to the resistance of said sampling resistor in a constant relative resistance ratio;
   a current source coupled to said first reference resistor for supplying current to the latter;
   a detector resistor for providing a reference potential;
   a second reference resistor having a resistance the magnitude of which is related to the resistance of said detector resistor in a constant relative resistance ratio;
   a first current circuit interconnected therewith for connecting said detector resistor to said second reference resistor;
   a second current circuit interconnected therewith for connecting said first reference resistor with said second reference resistor;
   said first and second current circuits and said first and second reference resistors being connected between said current source and said detector resistor for causing said detector resistor to provide said reference potential as a function of the current flowing through said first reference resistor; and
   a comparator coupled to a junction between said power element and said sampling resistor and to a junction between said first current circuit and said detector resistor for comparing said sampling potential with said reference potential to detect the presence of an overcurrent condition in said power element.

7. An overcurrent detecting apparatus according to claim 6, wherein all of said components are embedded in a semiconductor chip.

8. An overcurrent detecting apparatus according to claim 6, wherein said power element, said sampling resistor, and said first reference resistor are formed on a first substrate while said remaining components are formed on a second substrate.

9. An overcurrent detecting apparatus according to claim 6, wherein all of said components are formed on the same substrate.

* * * * *